(12) United States Patent
Sasaki et al.

(10) Patent No.: US 7,682,954 B2
(45) Date of Patent: Mar. 23, 2010

(54) METHOD OF IMPURITY INTRODUCTION, IMPURITY INTRODUCTION APPARATUS AND SEMICONDUCTOR DEVICE PRODUCED WITH USE OF THE METHOD

(75) Inventors: Yuichiro Sasaki, Tokyo (JP); Ichiro Nakayama, Osaka (JP); Bunji Mizuno, Nara (JP)

(73) Assignee: Panasonic Corporation, Osaka (JP)

( * ) Notice: Subject to any disclaimer, the term of this patent is extended or adjusted under 35 U.S.C. 154(b) by 469 days.

(21) Appl. No.: 10/599,205

(22) PCT Filed: Mar. 17, 2005

(86) PCT No.: PCT/JP2005/004790

§ 371 (c)(1),
(2), (4) Date: Sep. 22, 2006

(87) PCT Pub. No.: WO2005/093800

PCT Pub. Date: Oct. 6, 2005

(65) Prior Publication Data

US 2008/0142931 A1      Jun. 19, 2008

(30) Foreign Application Priority Data

Mar. 25, 2004   (JP) .............................. 2004-090455

(51) Int. Cl.
*H01L 21/425* (2006.01)
(52) U.S. Cl. ................... 438/514; 438/542; 438/565; 257/E21.211
(58) Field of Classification Search ........... 438/653, 438/542–550, 514–516, 519–520, 527–530, 438/540, 565–567; 427/539; 257/410, E21.211
See application file for complete search history.

(56) References Cited

U.S. PATENT DOCUMENTS

| 4,565,588 | A | 1/1986 | Seki et al. |
| 6,051,482 | A * | 4/2000 | Yang ........................... 438/526 |
| 6,403,410 | B1 | 6/2002 | Ohira et al. |
| 6,555,451 | B1 * | 4/2003 | Kub et al. ................... 438/542 |
| 6,890,605 | B2 * | 5/2005 | Nishikawa et al. .......... 427/539 |
| 2003/0207536 | A1 | 11/2003 | Miyasaka et al. |
| 2004/0241968 | A1 * | 12/2004 | Murakawa et al. .......... 438/513 |
| 2005/0224898 | A1 * | 10/2005 | Momose et al. ............. 257/410 |
| 2005/0250317 | A1 * | 11/2005 | Koh et al. ................... 438/653 |

FOREIGN PATENT DOCUMENTS

| JP | 60-138973 | 7/1985 |
| JP | 1-111320 | 4/1989 |
| JP | 1-111324 | 4/1989 |
| JP | 2000-208527 | 7/2000 |
| JP | 2003-68666 | 3/2003 |
| WO | 03/019636 | 3/2003 |

OTHER PUBLICATIONS

Chinese Office action with English translation.

(Continued)

*Primary Examiner*—Thanhha Pham
(74) *Attorney, Agent, or Firm*—Pearne & Gordon LLP

(57) ABSTRACT

An impurity region having a box-shaped impurity profile is formed.

An impurity introducing method includes a step of introducing a desired impurity into a surface of a solid base body, and a step of radiating plasma to a surface of the solid base body after the impurity introducing step thus forming an impurity profile having an approximately box-shape.

10 Claims, 4 Drawing Sheets

OTHER PUBLICATIONS

Lenoble et al, "Reliable and Enhanced Performances of sub-0.1 um pMOSFET's Doped by Low Plasma Doping", VLSI Symposium, IEEE and Japan Society of Applied Physics, pp. 110, 2000.

Mizuno, "Plasma Doping Technique", vol. 70, No. 12, pp. 1458-1462, 2001.

* cited by examiner

US 7,682,954 B2

METHOD OF IMPURITY INTRODUCTION, IMPURITY INTRODUCTION APPARATUS AND SEMICONDUCTOR DEVICE PRODUCED WITH USE OF THE METHOD

TECHNICAL FIELD

The present invention relates to an impurity introducing method, an impurity introducing apparatus and the semiconductor device which is formed by using the impurity introducing method and the impurity introducing apparatus, and more particularly to a control of an impurity introducing profile in plasma doping.

BACKGROUND OF THE INVENTION

Recently, along with the miniaturization of a semiconductor device, there has been a demand; or a technique which forms a shallow pn junction.

As a method for forming such a pn junction, ion implantation has been used conventionally. For example, a p-type impurity such as boron is introduced into an n-type silicon substrate by ion implantation and, thereafter, p-type impurity is electrically activated using a halogen lamp or the like thus forming the pn junction, and various devices are formed using such a pn junction.

Various attempts have been made to form the shallow junction using the ion implantation. Although the shallow junction may be formed by electrically activating the impurity which is injected by various annealing methods such as a flash lamp method, a laser annealing method and the like, a depth of the pn junction formed by the ion implantation is limited. For example, the shallow introduction of boron impurity is difficult. That is, it is difficult to set acceleration energy of B ions or $BF_2$ ions to low energy of several keV and hence, in she ion implantation, the depth of the ion introduced region is limited to approximately 10 nm from a surface of a substrate.

Accordingly, recently, as a technique which can efficiently form the shallower junction, various doping methods have been proposed and a plasma doping technique has been attracting an attention as a technique which is suitable for practical use among these doping methods. The plasma doping is a technique in which a reaction gas containing impurity to be introduced is excited in plasma and the plasma is radiated to a surface of the substrate thus introducing the impurity into the substrate. According to this technique, even when the impurity is boron, it is possible to form the shallow junction having a depth of 7 nm (see non-patent documents 1, 2, for example).

Non-patent document 1: Plasma Doping Technique: written by Bunji Mizuno (vol. 70, No. 12, p. 1458-1462 (2001)
Non-patent document 2: Reliable and enhanced performances of sub-0.1 µm pMOSFETs doped by low biased Plasma Doping, Damian Lenoble et al, VLSI Symposium, sponsored by IEEE and Japan Society of Applied Physics, p. 110, 2000.

DISCLOSURE OF THE INVENTION

Problems to be Solved by the Invention

However, the miniaturization of the semiconductor device has been in a rapid progress, and as a design size of a junction depth in the mass production, 100 nm or less has been used. Further, recently, 65 nm has been requested as such a design size. Under such circumstances, there has been a demand for a control technique with high accuracy in the introduction of impurity into a surface of a semiconductor substrate.

That is, there has been a demand for a technique which stably controls the formation of a shallow junction of an impurity introducing region having a depth of 50 nm or less, and further, a depth of 10 nm. Further, the stable formation of the junction of high concentration at a shallow position is important for achieving a rapid operational speed.

Under such circumstances, the formation of the shallow impurity region of high concentration has been a crucial task for the miniaturization and the high integration of a semiconductor device.

Particularly, to form the shallow impurity region with low resistance in a stable manner, it is necessary to make a change of an impurity concentration profile on a surface of a substrate gentle, that is, it is necessary to provide a so-called box-shaped impurity concentration profile. However, in introducing impurity into an ultra-shallow region, in many cases, the impurity concentration profile exhibits high concentration in the vicinity of the surface of the substrate normally but exhibits a sharp change as a depth of the impurity region is increased and hence, although the box-shaped control is ideal, such a control has been considered extremely difficult.

The present invention has been made under such circumstances and it is an object of the present invention to realize the extremely shallow and stable impurity introduction with high accuracy.

Further, it is another object of the present invention to form an impurity region which possesses a so-called box-shaped impurity profile.

Further, it is a particular object of the present invention to form an ultra-shallow impurity region in a stable manner.

Means for Solving the Problems

An impurity introducing method of the present invention is characterized by including a step of introducing a desired impurity into a surface of a solid base body, and a step of radiating plasma to a surface of the solid base body after the above-mentioned impurity introducing step.

That is, by radiating the plasma of low energy to the surface of the solid base body after the step of introducing the desired impurity into the surface of the solid base body, the impurity (boron: B) which is present in an ultra surface is knocked on with energy in the vertical direction thus imparting the dynamic energy in the vertical direction to the impurity whereby the impurity is knocked in the depth direction. Then, the impurity which is introduced to a depth position of a certain depth (10 nm) is no more knocked with plasma of low energy and hence, only the impurity which is present in the ultra surface is introduced up to the depth position of approximately 10 nm. Accordingly, the impurity concentration at the shallow position can be increased.

Further, in this phenomenon, by supplying the dynamic energy of the plasma perpendicular to the surface of the solid base body, it is possible to form an impurity region of high concentration at the shallow position without spreading the impurity in the lateral direction. In this manner, it is possible to obtain a box-shaped impurity concentration profile.

The impurity concentration profile in the depth direction before annealing the impurity such as boron which is introduced by ion implantation or plasma doping influences the electric property of a shallow activation layer after annealing. That is, provided that the depth of the activation layer is equal, a sheet resistance of the activation layer assumes a lowest value when the depth concentration profile of the impurity after annealing has the concentration distribution in which the concentration is distributed in a box-shape in a graph in which the impurity concentration is taken on an axis of ordinates and the depth of impurity is taken on an axis of abscissas. Here, when the depth concentration profile of the impurity before annealing approximates the box-shape, it is possible to easily make the depth concentration profile of the impurity after annealing have a more box-shape.

Then, by applying a heat treatment at a high temperature in a short period such as a flash-lamp annealing to the solid base body having such an impurity profile, the depth concentration profile of the impurity after annealing becomes substantially equal to the concentration profile of the impurity before annealing. The flash-lamp annealing method forms an activation layer with low sheet resistance and hence, has been developed as an activation method which hardly generates the diffusion of the impurity. By applying the flash-lamp annealing method, it is possible to reduce the sheet resistance thus realizing the high-speed operation of the device. That is, by forming the impurity concentration profile before annealing into the box-shape, it is possible to reduce the sheet resistance of the activation layer.

In this manner, according to the present invention, by performing the plasma radiation after introducing the impurity, it is extremely easy to form the concentration profile of the impurity such as boron which is introduced by ion implantation or plasma doping into a box-shape.

In the method of the present invention, the step of radiating the plasma may include a step of radiating inactive plasma into the semiconductor substrate.

Due to such a method, the plasma does not react with an element such as silicon which constitutes a semiconductor and hence, it is possible to form the concentration profile of the impurity which is introduced into the semiconductor substrate into a box-shape.

Further, in the method of the present invention, the step of radiating the plasma may include a step of adjusting a plasma radiation condition such that the impurity possesses a desired impurity profile in the semiconductor substrate.

By performing the plasma radiation while adjusting the plasma radiation condition to obtain the desired impurity profile, it is possible to realize the desired impurity profile.

Further, in the method of the present invention, the step of radiating the plasma may include a step of radiating plasma containing at least one kind of rare gas elements.

Due to such a method, by radiating the plasma containing at least one kind of rare gas elements, the generation of an undesired reaction can be prevented thus realizing the favorable imparting of energy to the impurity.

Further, in the method of the present invention, the step of radiating the plasma may include a step of radiating He plasma.

Due to such a method, since a mass of He is small, most of energy generated by collision can be imparted to the impurity and hence, it is possible to realize the efficient introduction of the impurity.

Further, in the method of the present invention, the step of radiating the plasma may include a step of radiating plasma which contains hydrogen.

Since the hydrogen can be easily taken out from the substrate due to external diffusion at annealing, according to this method, a hydrogen residual quantity in the base body after annealing is small and hence, the influence of the plasma on the property of the base body, particularly on the semiconductor property is small and the use of the plasma which contains hydrogen is desirable.

In the method of the present invention, the step of introducing the impurity may include a plasma doping step.

According to this method, particles are introduced into the solid base body with extremely low energy and hence, a shallower impurity introducing layer can be efficiently formed. Accordingly, it is possible to form the shallower junction.

In the method of the present invention, the step of introducing the impurity may include an ion implanting step.

According to this method, it is possible to enhance the controllability and the in-plane uniformity. Further, the use of low-energy ion implantation is desirable. This is because that the low-energy ion implantation enables the shallow implantation and is suitable for formation of the shallow junction which is an object of the present invention.

In the method of the present invention, the step of introducing the impurity may include a gas doping step.

The gas doping is a method which uses the impurity not in an ionic state but in an electrically neutral gas state and introduces the impurity into the semiconductor substrate by making use of the absorption or infiltration of gas molecules into the semiconductor substrate. According to this method, particles are introduced into the solid base body with extremely low energy and hence, a shallower impurity introducing layer can be efficiently formed. Accordingly, it impossible to form the shallower junction.

Further, an impurity introducing apparatus of the present invention is characterized by including an impurity introducing means which introduces desired impurity into a surface of a solid base body, an adjusting means which radiates plasma to a surface of the solid base body and adjusts the concentration distribution of the impurity in the inside of the solid base body, and an annealing means which activates the introduced impurity.

Further, the apparatus of the present invention includes a chamber, an impurity introducing means which introduces impurity into a surface of a solid base body which is arranged in the chamber, a plasma generating means which forms plasma on the surface of the solid base body, and an annealing means which anneals the solid base body in the inside of the chamber.

According to this apparatus, it is possible to efficiently perform the introduction of the impurity, the adjustment of the concentration distribution of the impurity, and the electric activation of the impurity from a view point of enhancing operability.

Further, the semiconductor device of the present invention is formed to have the impurity profile in which the impurity concentration at a position of a depth of 4 nm in the semiconductor device is set to $1/10$ or more of the impurity concentration on the surface of the semiconductor device.

Still further, the semiconductor device of the present invention is formed to have the impurity profile in which the impurity concentration at a position of a depth of 7 nm in the semiconductor device is set to $1/100$ or more of the impurity concentration on the surface of the semiconductor device.

The impurity introducing apparatus of the present invention is preferably an impurity introducing apparatus which excites a material which contains impurity and introduces the impurity into the inside of a solid base body from the excited material, wherein the impurity introducing apparatus includes a chamber which arranges the solid base body therein, a means which supplies a fixed quantity of the material into the inside of the chamber, a means which evacuates the inside of the chamber into vacuum, and a plasma generating means which forms the fixed quantity of material into plasma. Here, the means which supplies the fixed quantity of the material has a mechanism which measures and stores the material, wherein the mechanism controls a volume, a pressure and a temperature of a storing vessel so as to hold a fixed quantity of the material. Further, the storing vessel is configured to store a quantity of the material which corresponds to a quantity of the impurity introduced into the base body.

Due to such a constitution, it is possible to perform the sheet processing for introducing the impurity into the base body which constitutes a semiconductor substrate or a liquid crystal display substrate having a large diameter within a short period. Accordingly, the mass production ability of the semiconductor devices or the liquid crystal display devices which are formed using this apparatus is enhanced thus enabling the reduction of a manufacturing cost. Here, the material may be a gas, fine particles or fine liquid droplets.

For example, the material may contain any one of $B_2H_6$, $BF_3$, $AsH_3$, $PH_3$ as such a gas. Alternatively, the material may contain any one of B, As, P, Sb, In and Al as fine particles or a solid body. Here, liquid droplets mean a substance obtained by dissolving or mixing these fine particles and gases. Further, the liquid droplets may be formed to cover surfaces of the fine particles and gases.

Further, the timing for generating plasma may be set such that a profile of the impurity concentration in the vicinity of the surface of the solid base body is simulated and the plasma is generated based on a result of the simulation. Further, in place of the simulation of the profile of the impurity concentration, at least one selected from a group consisting of a flow speed, the number of gas molecules, a pressure of a gas, fine particles or fine liquid droplets is measured, and plasma may be generated in a state that the standard deviation of measured values reaches 2% or less.

Due to such a constitution, it is possible to adjust the profile of the impurity concentration easily and with favorable controllability.

Here, the present invention is capable of controlling the profile with high accuracy in introducing the impurity, and includes a point that the plasma is excited after the material is brought into an equilibrium on the surface of the solid base body, a point that the material on the surface of the solid base body is adjusted, a point that the material on the surface of the solid base body is adjusted such that the plasma is distributed in the desired distribution on the surface of the solid base body or the combination of these points. With such methods, plasma doping with the desired profile can be realized.

EFFECT OF THE INVENTION

According to the impurity introducing method of the present invention, by performing the plasma processing using inactive plasma such as He plasma after introducing the impurity into the surface of the substrate, it is possible to form the impurity region which has an approximately box-shaped profile.

BEST MODE FOR CARRYING OUT THE INVENTION

First Embodiment

Figure 1:
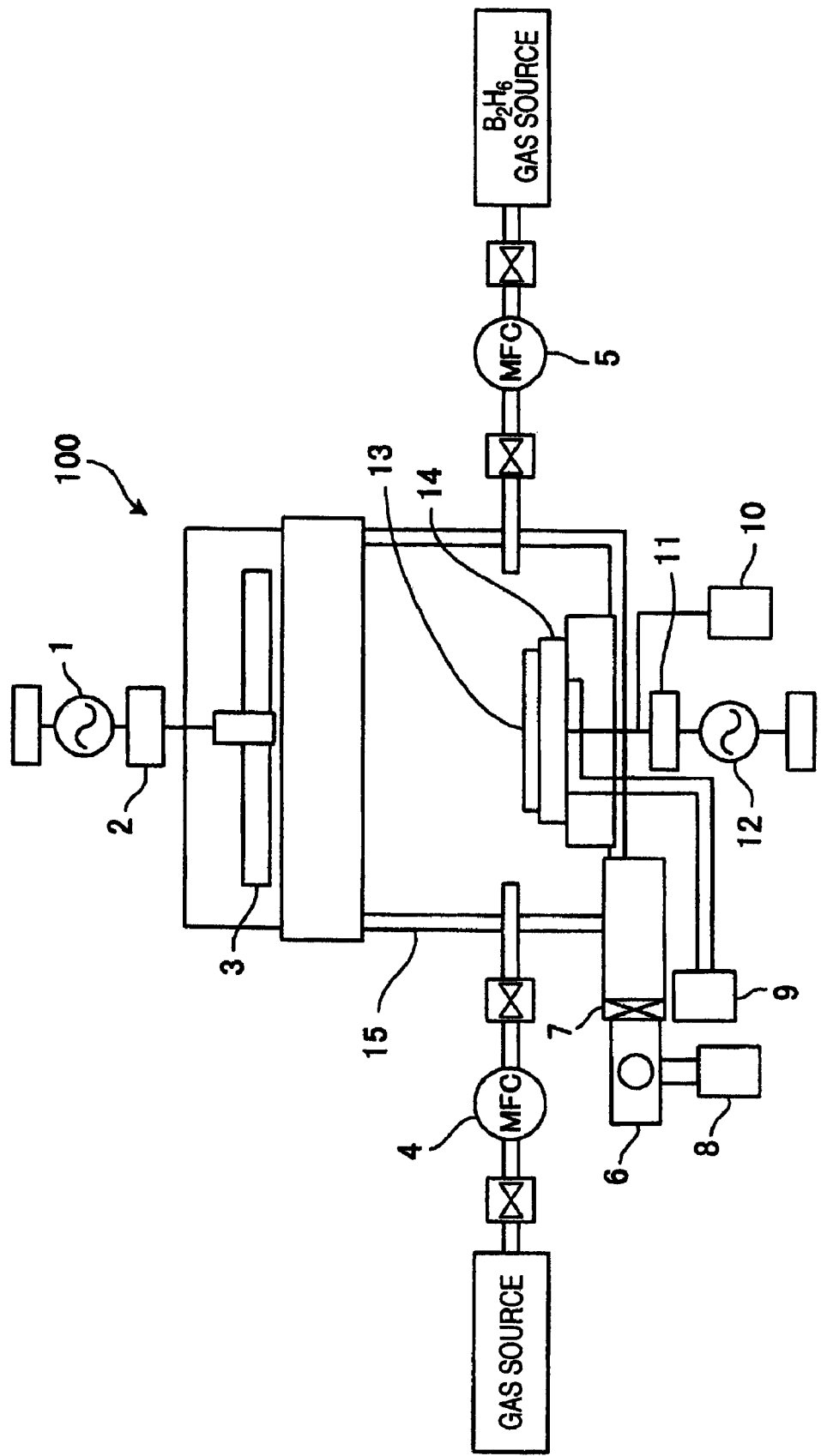
FIG. 1 is a schematic cross-sectional view of an impurity introducing apparatus used in an embodiment of the present invention.

Hereinafter, the first embodiment of the present invention is explained in conjunction with FIG. 1 and FIG. 2. An impurity introducing apparatus of this embodiment is characterized in that an impurity introducing profile can be adjusted by adjusting the distribution of a material in the vicinity of a surface of a base body. FIG. 1 is a cross-sectional view which shows the impurity introducing apparatus of the present invention schematically.

The impurity introducing apparatus 100 is, as shown in FIG. 1, constituted such that plasma doping, plasma radiation and annealing are sequentially performed in the inside of the apparatus. That is, in the apparatus, a semiconductor substrate which constitutes a substrate to be treated 13 is mounted on a susceptor which also functions as a lower electrode 14 mounted in the inside of a vacuum chamber 15 and a plasma generating region is formed in the vicinity of the surface of the substrate whereby the apparatus realizes plasma doping and plasma radiation. A coil 3 is mounted from a high-frequency power source 1 by way of a matching box 2 and a high-frequency power is supplied between the coil 3 and the lower electrode 14. Further, the lower electrode 14 is connected to a DC power source 10 and is also connected to the high-frequency power source 12 by way of the matching box 11.

Further, the degree of vacuum of the vacuum chamber 15 is adjusted by a turbo molecular pump 6 and a dry pump 8 which are connected to the vacuum chamber 15 by way of a conductance valve 7. Further, the lower electrode 14 is rotatably formed using a circulator 9. Further, in this chamber, an inert gas mass flow controller 4 for supplying an inert gas such as a He gas to the inside of the chamber is formed and, at a position in the chamber opposite to the inert gas mass flow controller 4, an impurity gas mass flow controller 5 for introducing a diborane gas is formed.

A main part of the impurity introducing apparatus is constituted in the above-mentioned manner. To form the sheet type apparatus which enables a rapid treatment, it is important to constitute the apparatus such that a volume of the whole apparatus, particularly a volume of the vacuum chamber 15 is set to a necessity minimum. Here, the plasma generating region is preferably formed using a helicon wave plasma source, ECR (Electron Cyclotron Resonance) plasma source or the like. With the use of such a plasma source, materials which contain impurity to be introduced into the substrate to be treated 13 or a gas for plasma radiation, that is, here, $B_2H_6$ and He gases are respectively excited in plasma in respective steps.

In supply systems of gas materials which contain the above-mentioned impurities, fixed quantities of the materials are supplied to the vacuum chamber 15 by way of the mass flow controllers 4, 5. The supplying quantities of the gas materials are determined based on the mass flow controllers 4, 5 and a volume, a temperature and a degree of vacuum of the vacuum chamber 15 and are respectively monitored by thermometers and pressure gauges. Although not shown in the drawing, the gas temperatures and gas pressures are stably controlled by temperature control parts and pressure control parts thereof.

Here, although the supply of the gasses is performed by way of the mass flow controllers 4, 5, the supply of the gasses can be strictly defined by a pressure control. Here, the gas indicates, a $B_2H_6$ gas, a $BF_3$ gas, an $AsH_3$ gas, a $PH_3$ gas, or a gas formed by diluting these gasses with an inert gas.

The impurity introducing apparatus of the present invention is an apparatus which excites a material containing impurity in plasma and dopes the impurity into the substrate. However, different from dry etching such as an RIE (Reactive Ion Etching) or CVD (Chemical Vapor Deposition) which continuously supplies a reaction gas to a reaction chamber thus generating plasma, the impurity introducing apparatus of the present invention can form a fixed quantity of gas corresponding to an introducing quantity (dose quantity) of the impurity to the substrate in plasma with high accuracy. This constitution enables the extremely shallow impurity introduction and the control of the introduction depth of the impurity with high accuracy.

Further, this impurity introducing apparatus of the present invention enables the impurity introduction which forms the extremely shallow junction to the semiconductor substrate (solid base body) in a rapid treatment with high accuracy and high concentration and the sheet treatment can be performed ill a short period. Accordingly, it is possible to form a highly reliable semiconductor device having high accuracy with favorable productivity. Further, when the impurity introducing apparatus is applied to a liquid crystal display substrate, minute impurity regions are formed in a silicon thin film which is formed on the glass substrate which mounts liquid crystal thereon and TFTs are arranged on the minute impurity regions and hence, it is possible to form a minute active-matrix type liquid crystal display device and, at the same time, it is possible to enhance the mass productivity and to realize the reduction of a manufacturing cost.

In the impurity introducing apparatus shown in FIG. 1, a DC power source 10 or a high-frequency power source 12 may be mounted on a susceptor which also functions as a lower electrode 14 as a susceptor. Here, a frequency of the high-frequency power source is 100 kHz to 10 MHz. By using these power sources, a DC potential within a range of several eV to 1 keV is generated between the generated plasma and the substrate 13 to be treated. Further, by applying a rotation of approximately 10 rpm, for example, to the substrate 14 to be treated in a horizontal plane by using the circulator 9 which rotates the lower electrode which constitutes the susceptor, the uniformity of in-plane impurity dose quantity of the substrate 13 to be treated is further enhanced.

Further, as the material which contains impurities supplied by way of impurity gas mass flow controllers, besides the material which assumes a gaseous form at a normal temperature and under a normal pressure as mentioned above, a solid body such as fine particles of B, As, P, Sb, In, Al, Si or a liquid which contains the above-mentioned impurities or solid fine particles which are coated with a liquid may be used. Here, although, in this case, the supply system shown in FIG. 1 may slightly differ from the supply system for the material in a gaseous form, what is necessary is that a fixed quantity of material which contains the impurities can be supplied.

Figure 2:
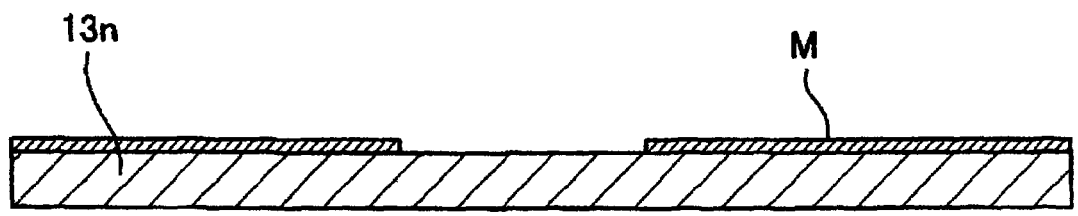
FIG. 2 is a cross-sectional view of steps showing an impurity introducing method of the first embodiment of the present invention.
Figure 2:
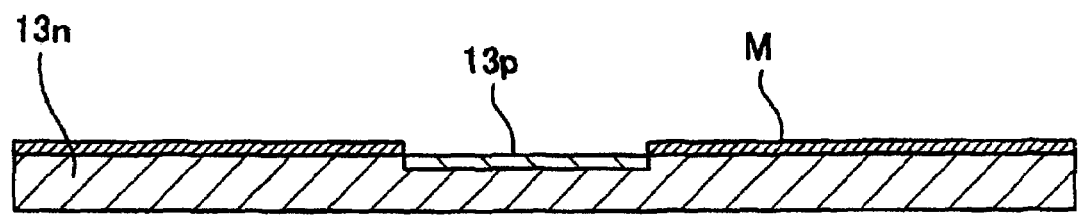

Next, the impurity introducing method of the present invention is explained in conjunction with FIG. 1 and FIG. 2. FIG. 2 is a cross-sectional view schematically showing impurity introducing steps of the embodiment of the present invention.

First of all, as shown in FIG. 2 (a), a mask M is formed on a surface of n-type silicon substrate 13n having the resistivity of 10 Ωcm and a diameter of 300 mmΦ using photolithography. The substrate 13 to be treated formed of the n-type silicon substrate 13n on which the mask M is formed in this manner is placed on and fixed to the lower electrode 14 which constitutes the susceptor by electrostatic attraction. Here, the turbo molecular pump 6 and the dry pump 8 are operated so as to set a degree of vacuum in the inside of the vacuum chamber 15 to approximately $10^{-5}$ Pa.

After establishing such a state in the vacuum chamber, a fixed quantity of diborane $B_2H_6$ having a concentration of 5% which is diluted with He is supplied into the inside of vacuum chamber 15 by way of the mass flow controller 5 and, at the same time, a diborane $B_2H_6$ gas which is filled in the inside of the vacuum chamber 15 is excited in plasma by the DC power source 10 and the high-frequency power source 1, 12 and plasma doping is supplied to the surface of the substrate to be treated. Here, the plasma doping is continued for 7 seconds at a gas pressure of 2.5 Pa in the inside of the vacuum chamber and with a bias voltage of 60V.

Subsequently, a 100% He gas is exposed to plasma for 60 seconds with a bias voltage of 75V by way of the mass flow controller 4 thus performing He plasma post-processing. Here, the pressure in the inside of the vacuum chamber is adjusted to 0.9 Pa. Here, a cooling mechanism is provided to the lower electrode 14 for preventing the elevation of base-body temperature. Accordingly, an upper limit of the surface temperature of the surface to be treated is set to 200° C. and the further elevation of the surface temperature is inhibited.

Due to the above-mentioned steps, as shown in FIG. 2 (b), a p-type impurity region 13P having a depth of approximately 7 nm is formed in regions which are exposed from the mask M.

Figure 3:
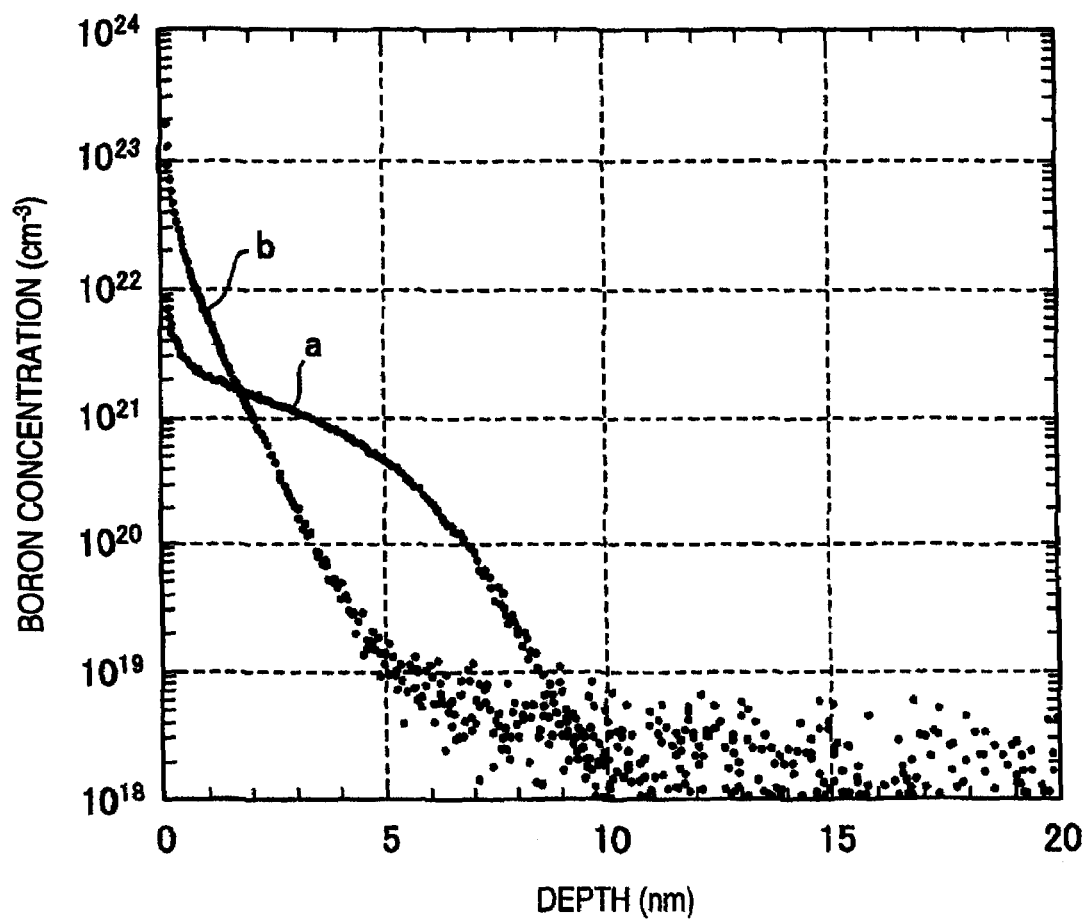
FIG. 3 is a view showing SIMS data showing impurity profiles of an impurity region which is obtained by the embodiment of the present invention and a comparison example 1.

The impurity profile is measured using an SIMS in this state. The result is indicated by a curve "a" in FIG. 3. For a comparison purpose, as a comparison example 1, an impurity profile before He plasma post-processing, that is, after plasma doping processing is indicated by a curve "b". In FIG. 3, boron concentration ($cm^{-3}$) is taken on an axis of ordinates and a depth (nm) is taken on an axis of abscissas. From the comparison of these examples, it is understood that, by performing He plasma post-processing, the impurity concentration profile further approximates a box shape.

From this drawing, it is understood that the impurity profile of the impurity region 13P which is formed by the method of the present invention exhibits the impurity concentration at a depth position of 4 nm which is 1/10 or more of the impurity concentration on a surface and exhibits the impurity concentration at a depth position of 7 nm which is 1/100 or more of the impurity concentration on the surface. On the other hand, the impurity profile after plasma doping is sharply lowered from the surface.

Although this mechanism is not certain, it is considered that according to the present invention, atom B is moved to a deep region due to a knocking-on effect of He ion. That is, it is considered that by knocking the impurity with the plasma of low energy (low energy He plasma), the impurity (B) which is present on an ultra surface is knocked on. Then, it is considered that the atoms which is introduced to a certain depth (10 nm) is no more knocked with the He plasma and hence, the impurity which is present on the ultra surface moves to a deep position. The impurity which moves to a certain depth no more moves to deeper position and hence, such a profile as indicated by the curve "a" in FIG. 3 can be obtained. Here, basically, knocking-on, that is, striking is used for imparting dynamic energy in the depth direction. The boron element selectively moves in the vertical direction, and the diffusion in the lateral direction is hardly generated although the diffusion is slightly generated due to the collision with a Si element thus enabling the formation of a minute and shallow impurity region with high accuracy. The measurement device which is used here can measure only within a range of approximately 4 digits and a region where a large number of points are dotted is an unmeasurable region.

Figure 4:
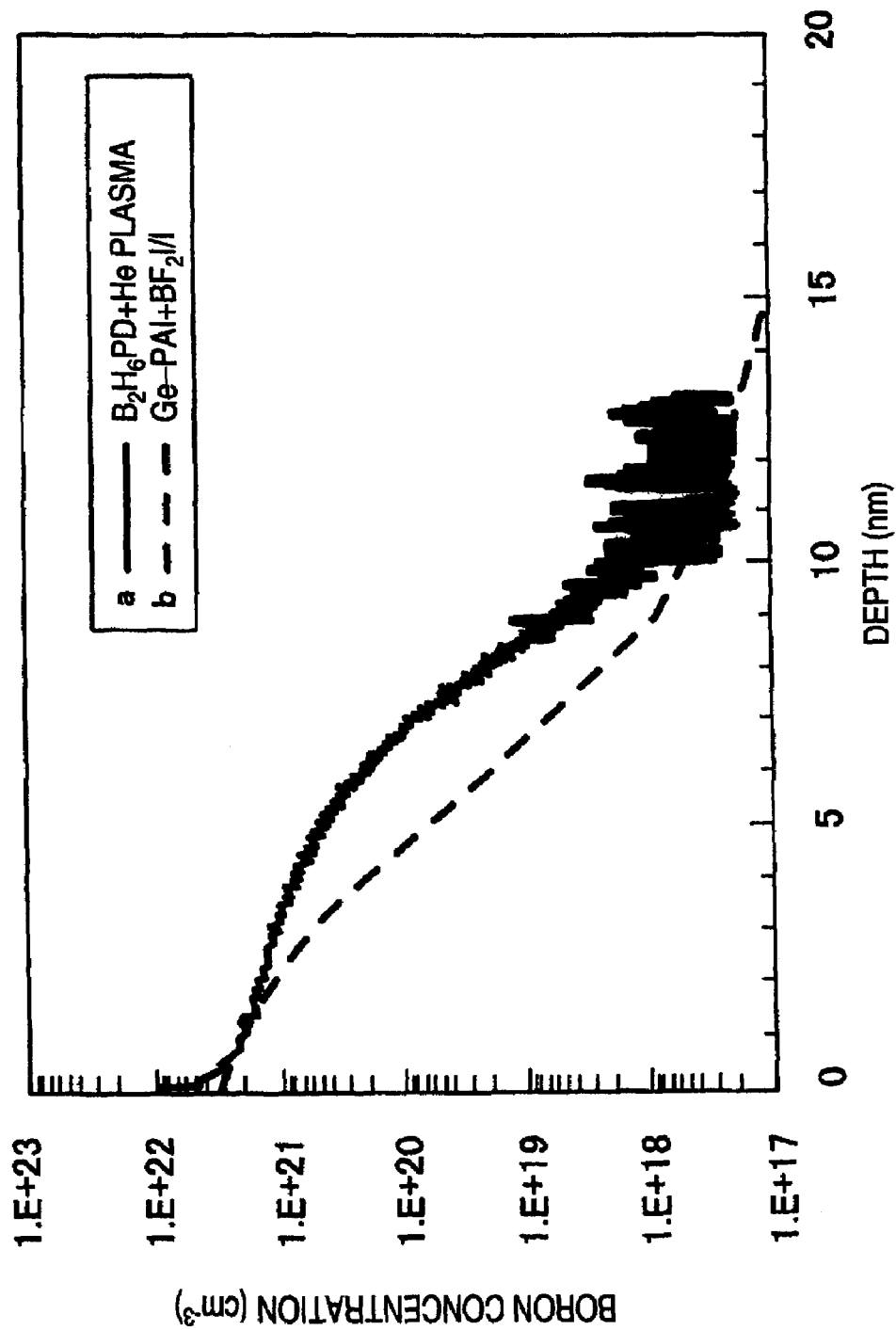
FIG. 4 is a view showing SIMS data showing impurity profiles of an impurity region which is obtained by the embodiment of the present invention and a comparison example 2. In the drawings, 1: high-frequency power source, 2: matching box, 3: coil, 4, 5: mass flow controller, 6: turbo molecular pump, 7: conductance valve, 8: dry pump, 9: circulator, 10: DC power source, 11: matching box, 12: high-frequency power source, 13: substrate to be treated, 13n: n-type silicon substrate, 13p: p-type impurity region, M: mask, 14: lower electrode, 15: vacuum chamber, 100: apparatus

For a comparison purpose, as a comparison example 2, Ge-PRI, that is, pre-processing by germanium ion implantation which is recently supposed to be extremely effective is performed to form impurity regions. The impurity regions can be obtained such that the surface of the substrate to be treated is preliminarily formed into an amorphous state by implanting germanium ion, and, thereafter, $BF_2$ ion is implanted. Ge-PAI is a technique which is considered to be capable of performing an impurity profile control with the highest accuracy under the present situation. The result is indicated by the curve "b" in FIG. 4. The impurity concentration profile of the above-mentioned embodiment of the present invention is indicated by the curve "a". From comparison of these examples, it is understood that the impurity regions obtained by the method of the present invention form the impurity profile having a shape which further approximates a box shape.

Thereafter, although not shown in FIG. 1, RTA (rapid thermal treatment) or flash lamp annealing is applied to the substrate 13 to be treated in the inside of another chamber in the multi-chamber constitution. In this manner, in the impurity introducing method according to the present invention, it is possible to form the uniform and shallow impurity regions in the vicinity of the surface of the substrate 13 to be treated. Here, as an annealing treatment, a spike RTA, a flash lamp annealing (FLA), laser annealing or the like can be adopted. When a spike RTA at 1000° C. is used, it is preferable to set a temperature increasing rate to approximately 200° C./sec and a temperature decreasing rate to approximately 60° C./sec. Further, when the flash lamp annealing (FLA) is used, an annealing temperature and an annealing time may be set to 1100 to 1300° C. and 1 msec, when the laser annealing is used, annealing energy and an annealing time may be set to 1500 mJ/cm$^2$, 100 nsec as a whole solid laser.

In this manner, by the He plasma post-processing according to the present invention, it is possible to make the shallow junction profile by plasma doping to approximate a box shape due to the post-processing of He plasma.

Here, due to the plasma radiation to the above-mentioned substrate 13 to be treated, the material which contains the impurity to be introduced is introduced into the surface of the substrate 13 to be treated or in the inside thereof either in an attraction mode or in a low energy (several eV to 1 keV) ion implantation mode. Here, in the attraction mode, to the surface of the substrate 5 to be treated, the material is physically attracted and, at the same time, active species such as neutral radicals of the above-mentioned material generated by the above-mentioned plasma excitation are chemically absorbed.

On the other hand, as a modification of the impurity introducing method, an ion implantation method or a gas doping method may be used in place of plasma doping.

Here, the plasma which is used in this embodiment may be suitably selected from helicon wave plasma, ECR plasma, parallel plasma and the like.

Second Embodiment

In the above-mentioned embodiment, the semiconductor substrate which forms a semiconductor device is explained as the substrate to be treated. However, the present invention is applicable, in the exactly same manner, to a case when the substrate to be treated is a glass substrate which forms a liquid crystal display device and constitutes a matrix substrate.

Further, the present invention is not limited to the above-mentioned embodiments and the embodiments can be suitably modified within a range of technical concept of the present invention.

Here, in the above-mentioned embodiment, the method for introducing impurities under the reduced pressure is explained. However, the impurities may be introduced under a normal pressure.

INDUSTRIAL APPLICABILITY

As has been explained heretofore, the present invention can obtain the impurity profile having the approximately box shape by knocking on the impurities at the shallow position using gas plasma such as He after introducing the impurities and hence, the present invention is applicable to the formation of impurity region which can cope with the miniaturization, the high integration such as the formation of a DRAM on a SOI (silicon on insulator) substrate on which a silicon thin film is formed on the substrate surface by way of an insulation film, the formation of a liquid crystal panel in which liquid crystal driving, circuits containing thin film transistors (TFT) or the like are integrated.

The invention claimed is:

1. An impurity introducing method which comprises:
   a step of introducing an impurity selected from a group consisting of B, As, P, Sb and In into a surface of a semiconductor substrate; and
   a step of radiating inactive He plasma to the surface of the semiconductor substrate after the impurity is introduced in the impurity introducing step, wherein the inactive He plasma is radiated while the semiconductor substrate is cooled.

2. The impurity introducing method according to claim 1, wherein the step of radiating the plasma includes a step of radiating plasma such that the impurity possesses a desired impurity profile in the semiconductor substrate.

3. The impurity introducing method according to claim 1, wherein a temperature of the surface of the semiconductor substrate is kept below 200 degree Celsius.

4. The impurity introducing method according to claim 3, wherein the temperature of the surface of the semiconductor substrate is kept below 100 degree Celsius.

5. The impurity introducing method according to claim 1, wherein the step of introducing the impurity includes a plasma-doping step.

6. The impurity introducing method according to claim 1, wherein the step of introducing the impurity includes an ion-implanting step.

7. The impurity introducing method according to claim 1, wherein the step of introducing the impurity includes a gas-doping step.

8. An impurity introducing method comprising:
   a step of introducing an impurity selected from a group consisting of B, As, P, Sb and In into a surface of a semiconductor substrate; and
   a step of radiating inactive He plasma to the surface of the semiconductor substrate after the impurity introducing step such that the impurity concentration at a depth position of 4 nm is set to be 1/10 or more of the impurity concentration on the surface of the semiconductor substrate, wherein the inactive He plasma is radiated while the semiconductor substrate is cooled.

9. The impurity introducing method according to claim 8, wherein the impurity concentration at a depth position of 7 nm is set to be 1/100 or more of the impurity concentration on the surface of the semiconductor substrate.

10. An impurity introducing method comprising:
    a step of introducing an impurity selected from a group consisting of B, As, P, Sb and In into a surface of a semiconductor substrate; and
    a step of radiating inactive He plasma to the surface of the semiconductor substrate after the impurity is introduced in the impurity introducing step, wherein the inactive He plasma knocks the impurity introduced in the surface, wherein the inactive He plasma is radiated while the semiconductor substrate is cooled.

* * * * *

UNITED STATES PATENT AND TRADEMARK OFFICE
CERTIFICATE OF CORRECTION

| | | |
|---|---|---|
| PATENT NO. | : 7,682,954 B2 | Page 1 of 1 |
| APPLICATION NO. | : 10/599205 | |
| DATED | : March 23, 2010 | |
| INVENTOR(S) | : Yuichiro Sasaki, Ichiro Nakayama and Bunji Mizuno | |

It is certified that error appears in the above-identified patent and that said Letters Patent is hereby corrected as shown below:

In Column 1, line 18, please delete "demand; or" and insert therefor --demand for--.

In Column 1, line 35, please delete "she" and insert therefor --the--.

In Column 7, line 20, please delete "ill" and insert therefor --in--.

In Column 8, line 64, please delete "Ge-PRI" and insert therefor --Ge-PAI--.

Signed and Sealed this

Twenty-second Day of June, 2010

David J. Kappos
*Director of the United States Patent and Trademark Office*